United States Patent
Guo et al.

(10) Patent No.: US 11,515,371 B2
(45) Date of Patent: Nov. 29, 2022

(54) DISPLAY DEVICE WITH FINGERPRINT RECOGNITION SENSOR AND MANUFACTURING METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Wenfeng Guo, Beijing (CN); Chao Fu, Beijing (CN); Fei Li, Beijing (CN); Guangjie Yang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 260 days.

(21) Appl. No.: 16/767,812

(22) PCT Filed: Nov. 18, 2019

(86) PCT No.: PCT/CN2019/119192
§ 371 (c)(1),
(2) Date: May 28, 2020

(87) PCT Pub. No.: WO2020/103795
PCT Pub. Date: May 28, 2020

(65) Prior Publication Data
US 2020/0350376 A1  Nov. 5, 2020

(30) Foreign Application Priority Data
Nov. 23, 2018 (CN) .......................... 201811409464.2

(51) Int. Cl.
*H01L 27/32* (2006.01)
*H01L 51/56* (2006.01)
(Continued)

(52) U.S. Cl.
CPC .......... *H01L 27/3234* (2013.01); *G06K 19/07* (2013.01); *G06K 19/0703* (2013.01);
(Continued)

(58) Field of Classification Search
None
See application file for complete search history.

(56) References Cited

U.S. PATENT DOCUMENTS

| 2018/0151641 A1 | 5/2018 | Choo et al. |
| 2019/0053377 A1* | 2/2019 | Lee .......................... H05K 1/028 |

(Continued)

FOREIGN PATENT DOCUMENTS

| CN | 205003632 U | 1/2016 |
| CN | 205508290 U | 8/2016 |

(Continued)

OTHER PUBLICATIONS

Machine translation of CN 107169452 (Year: 2017).*

(Continued)

*Primary Examiner* — J. E. Schoenholtz
(74) *Attorney, Agent, or Firm* — Perilla Knox & Hildebrandt LLP; Kenneth A. Knox

(57) ABSTRACT

The present disclosure provides a display device, a display apparatus, and a method for manufacturing a display device. The display device comprises a mainboard, a display panel disposed on the mainboard, and a fingerprint recognition sensor. The fingerprint recognition sensor is disposed on the mainboard, and the fingerprint recognition sensor is located between the mainboard and the display panel. A groove is formed on a surface of the display panel facing the mainboard, and an orthographic projection of the groove on the mainboard corresponds to a position of the fingerprint
(Continued)

recognition sensor. The groove is configured to form an air gap between the fingerprint recognition sensor and the display panel.

11 Claims, 3 Drawing Sheets

(51) Int. Cl.
    *G06K 19/07*     (2006.01)
    *G06V 40/12*     (2022.01)
    *G06V 40/13*     (2022.01)
    *G06K 7/10*     (2006.01)

(52) U.S. Cl.
    CPC .............. *G06V 40/12* (2022.01); *G06V 40/13* (2022.01); *G06V 40/1318* (2022.01); *H01L 27/323* (2013.01); *H01L 27/3227* (2013.01); *H01L 51/56* (2013.01); *G06K 7/1095* (2013.01)

(56) References Cited

U.S. PATENT DOCUMENTS

| | | | |
|---|---|---|---|
| 2020/0057902 A1* | 2/2020 | Kim | ....................... H04M 1/725 |
| 2021/0342567 A1* | 11/2021 | Park | ................... G06V 40/1329 |

FOREIGN PATENT DOCUMENTS

| | | | | |
|---|---|---|---|---|
| CN | 206292753 U | | 6/2017 | |
| CN | 107169452 A | * | 9/2017 | ......... G06K 9/00006 |
| CN | 107169452 A | | 9/2017 | |
| CN | I614695 B | | 2/2018 | |
| CN | 108388847 A | | 8/2018 | |
| CN | 108416319 A | | 8/2018 | |
| CN | 108717832 A | | 10/2018 | |
| CN | 208001303 U | | 10/2018 | |
| CN | 109543618 A | | 3/2019 | |
| TW | M549446 U | | 9/2017 | |
| WO | 2018205865 A1 | | 11/2018 | |
| WO | 2019179446 A1 | | 9/2019 | |

OTHER PUBLICATIONS

International Search Report and Written Opinion dated Feb. 27, 2020 for PCT Patent Application No. PCT/CN2019/119192.
1st Office Action dated Apr. 28, 2020 for Chinese Patent Application No. 201811409464.2.
2nd Office Action dated Nov. 2, 2020 for Chinese Patent Application No. 201811409464.2.

* cited by examiner

DISPLAY DEVICE WITH FINGERPRINT RECOGNITION SENSOR AND MANUFACTURING METHOD THEREOF

CROSS-REFERENCE TO RELATED APPLICATIONS

The present application is a national phase application under 35 U.S.C. § 371 of International Patent Application No. PCT/CN2019/119192, filed on Nov. 18, 2019, which claims the benefit of and priority to Chinese Patent Application No. 201811409464.2, entitled "DISPLAY DEVICE, DISPLAY APPARATUS AND METHOD FOR MANUFACTURING DISPLAY DEVICE," filed on Nov. 23, 2018, the entire contents of which are incorporated herein by reference.

TECHNICAL FIELD

The present disclosure relates to an application of fingerprint recognition technology in the field of display technology and, in particular, to a display device, a display apparatus, and a method for manufacturing a display device.

BACKGROUND

At present, fingerprint recognition is widely used as an important function in display technology. In the related art, a fingerprint recognition sensor module (for example, a fingerprint recognition sensor) is generally provided on a display panel. Specifically, a glue frame is attached to the display panel, and the glue frame has a certain height such that, when the fingerprint recognition sensor is disposed on the glue frame, an air gap may be formed between the fingerprint recognition sensor and the display panel to meet function requirements of the fingerprint recognition sensor. The fingerprint recognition sensor is adhered to the glue frame by an edge sealant so that the fingerprint recognition sensor and the display panel may be fixed to each other.

However, there are two main defects in the above-mentioned design of the fingerprint recognition module. One defect is reliability-test impression. The glue frame, edge sealant, and display device have different thermal expansion coefficients and shrinkage coefficients, which results in that after the fingerprint recognition module is placed in an environmental reliability test, the display panel is deformed, and an apparent impression on a region corresponding to the fingerprint recognition sensor may be seen from the front of the display panel, which affects product appearance. The other defect is that the fingerprint recognition sensor is easily loosened. The edge sealant for fixing the fingerprint recognition sensor is only dispensed on the glue frame to fix the fingerprint recognition sensor on the glue frame, therefore the fingerprint recognition sensor only depends on the adherence of the glue frame to be fixed on the display panel (such as an OLED panel). When undergoing some mechanical tests, the above-mentioned fixing structure easily becomes loose and comes off.

SUMMARY

According to an aspect of the present disclosure, there is provided a display device including a mainboard, a display panel disposed on the mainboard, and a fingerprint recognition sensor. The fingerprint recognition sensor is disposed on the mainboard, and the fingerprint recognition sensor is located between the mainboard and the display panel. A groove is formed on a surface of the display panel facing the mainboard, and an orthographic projection of the groove on the mainboard corresponds to a position of the fingerprint recognition sensor. The groove is configured to form an air gap between the fingerprint recognition sensor and the display panel.

According to an embodiment of the present disclosure, an outer periphery of the fingerprint recognition sensor is adhered and fixed to the mainboard by an edge sealant layer.

According to an embodiment of the present disclosure, a part of the outer periphery of the fingerprint recognition sensor is adhered and fixed to the mainboard by the edge sealant layer.

According to an embodiment of the present disclosure, a shape of the groove is the same as that of a part of the fingerprint recognition sensor to which the edge sealant layer is adhered.

According to an embodiment of the present disclosure, a size of the groove is same as that of the part of the fingerprint recognition sensor to which the edge sealant layer is adhered.

According to an embodiment of the present disclosure, the groove has a depth of 20 μm to 50 μm.

According to another aspect of the present disclosure, there is provided a display apparatus, which includes the display device proposed by the present disclosure and as described in the above embodiment.

According to yet another aspect of the present disclosure, there is provided a method for manufacturing a display device, including:

providing a mainboard, a display panel, and a fingerprint recognition sensor;

fixing the fingerprint recognition sensor on the mainboard;

forming a groove on a surface of the display panel, wherein the groove corresponds to a position of the fingerprint recognition sensor; and coupling the surface of the display panel to the mainboard, so that an air gap is formed between the fingerprint recognition sensor and the display panel by the groove.

According to an embodiment of the present disclosure, in the step of fixing the fingerprint recognition sensor on the mainboard, the fingerprint recognition sensor is adhered and fixed to the mainboard by an edge sealant layer.

According to an embodiment of the present disclosure, in the step of forming a groove on a surface of the display panel, the groove is formed by cutting the display panel through a laser cutting method.

BRIEF DESCRIPTION OF THE DRAWINGS

Various objects, features, and advantages of the present disclosure will become more apparent by considering the following detailed description of embodiments of the present disclosure in conjunction with the accompanying drawings. The drawings are merely exemplary illustrations of the present disclosure and are not necessarily drawn to scale. In the drawings, the same reference numerals always denote the same or similar parts, in which.

DETAILED DESCRIPTION

Figure 1:
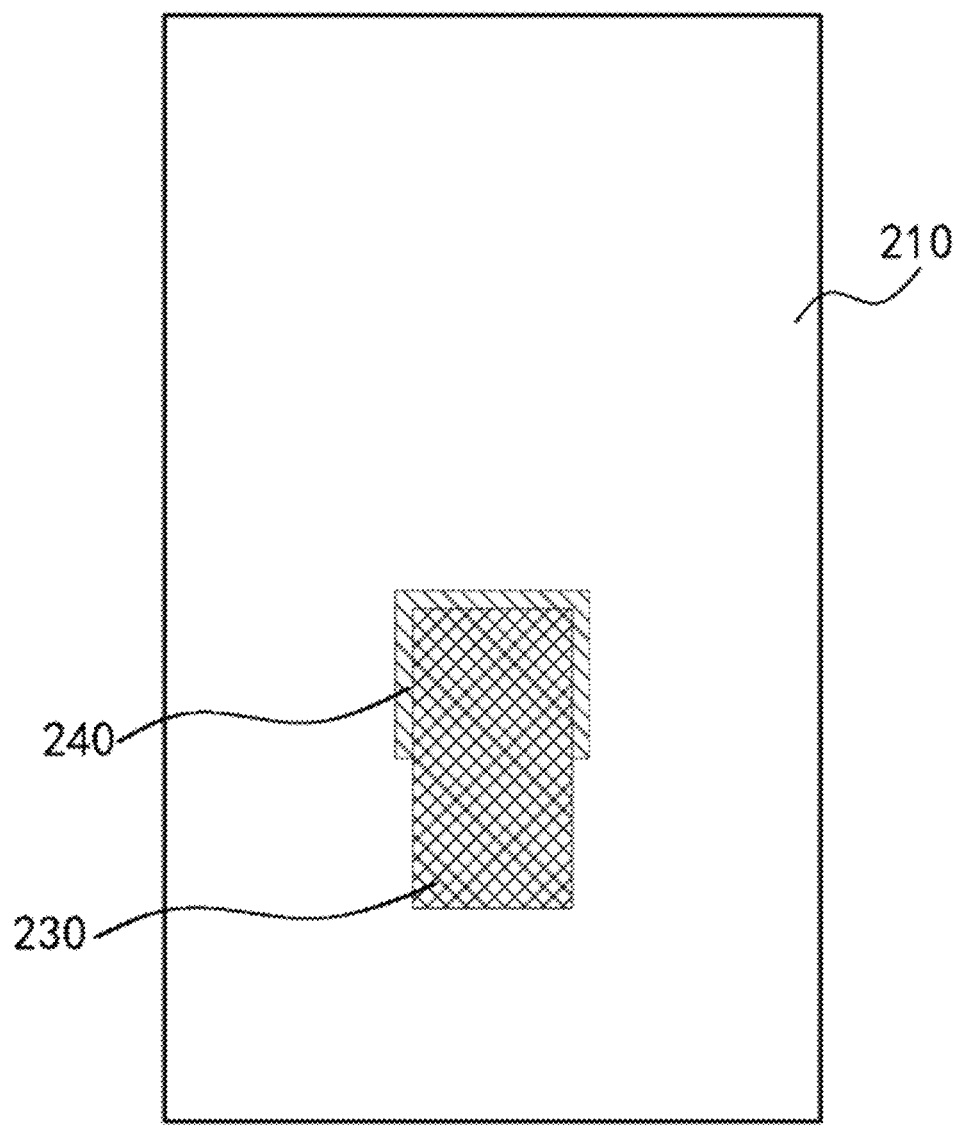
FIG. 1 is a schematic structural diagram of a mainboard of a display device according to an exemplary embodiment.

Exemplary embodiments embodying features and advantages of the present disclosure will be described in detail in the following description. It should be understood that there may be various changes in different embodiments of the present disclosure, all of which do not depart from the scope of the present disclosure. The descriptions and drawings therein are illustrative in nature, and are not intended to limit the present invention.

The following description of different exemplary embodiments of the present disclosure is made with reference to the accompanying drawings, which form a part of the present disclosure, and in which different exemplary structures, systems and steps that can implement various aspects of the present disclosure are shown by way of example. It should be understood that structures and functions may be modified by using other specific solutions of components, structures, exemplary devices, systems, and steps without departing from the scope of the present disclosure. Moreover, although the terms "on", "between", "within", or the like may be used in the specification to describe different exemplary features and elements of the present disclosure, these terms are used herein for convenience of description only, for example, according to directions of examples described in the drawings. Nothing in the specification should be understood as requiring a specific three-dimensional orientation of the structure to fall within the scope of the present disclosure.

FIG. 1 schematically shows a schematic structural diagram of a mainboard of a display device provided by the present disclosure. In this exemplary embodiment, the display device provided by the present disclosure is explained by taking a display device having a fingerprint recognition function such as a mobile phone or a Pad as an example. It can be easily understood by those skilled in the art that, in order to apply the related design of the present disclosure to other types of display devices with the fingerprint recognition function or other fields, various modifications, additions, substitutions, deletions, or other changes may be made to the following embodiments, which are still within the scope of the principle of the display device of the present disclosure.

Figure 2:
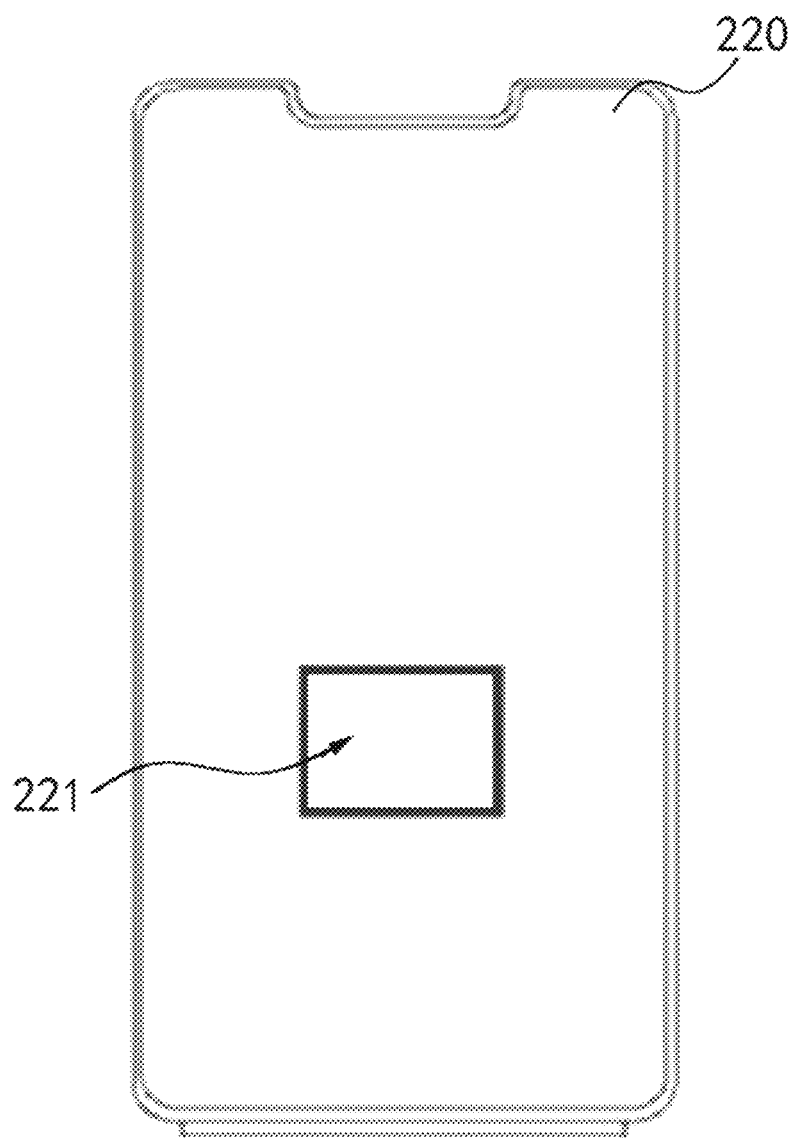
FIG. 2 is a schematic structural diagram of a display panel of the display device shown in FIG. 1.
Figure 3:
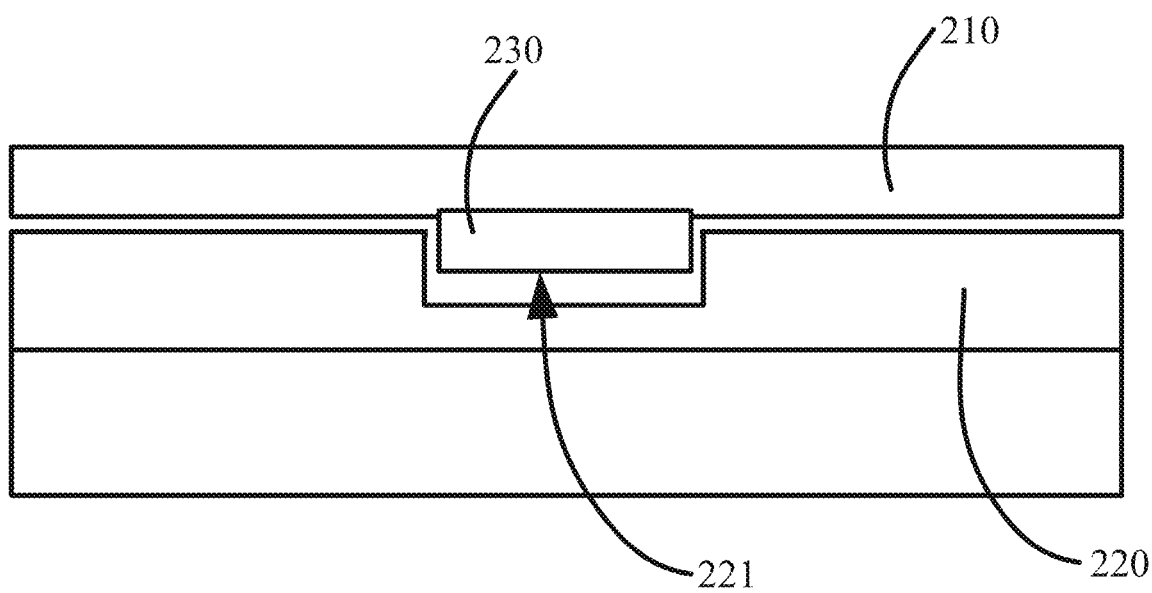
FIG. 3 is a partial cross-sectional view of the display device shown in FIG. 1.

As shown in FIG. 1, in an embodiment, the display device provided by the present disclosure mainly includes a mainboard 210, a display panel 220 and a fingerprint recognition sensor 230. The display panel 220 is disposed on the mainboard 210. For example, a surface of the display panel 220 is attached to the mainboard 210. Taking that the display device is a display device (for example an OLED display device) with a fingerprint recognition function such as a mobile phone or a Pad as an example, pin-hole fingerprint recognition technology under a screen of the display device is generally implemented based on the principle of pin-hole imaging. That is, light reflected by fingerprints passes through pin-holes under the screen and is received at a mirror surface of the fingerprint recognition sensor. In a related fingerprint recognition module, an air gap required for the above light transmission is controlled by a thickness of a glue frame (that is, in the related fingerprint recognition module, the fingerprint recognition sensor is fixed on the glue frame of the display panel). FIG. 2 representatively shows a schematic structural diagram of the display panel 220 of the display device which may embody the principle of the present disclosure, and FIG. 3 representatively shows a partial cross-sectional view of the display device which may embody the principle of the present disclosure, which would be cooperatively referred to. Structures, connection manners, and functional relationships of main components of the display device provided by the present disclosure will be described in detail below in conjunction with the aforementioned drawings.

As shown in FIGS. 1 and 2, in an embodiment, the fingerprint recognition sensor 230 is disposed on the mainboard 210 such as a main circuit board of a mobile phone or Pad, and the fingerprint recognition sensor 230 is disposed on the surface of the mainboard 210 to which the display panel 220 is attached. That is, the fingerprint recognition sensor 230 is located between the mainboard 210 and the display panel 220 after the mainboard 210 is attached to the display panel 220. A groove 221 is formed on a surface of the display panel 220 facing the mainboard 210 (that is, the surface of the display panel 220 attached to the mainboard 210), and the groove 221 corresponds to a position of the fingerprint recognition sensor 230. By controlling a difference between a depth of the groove 221 and a thickness of the fingerprint recognition sensor 230 protruding from the mainboard 210, the groove 221 opened in the display panel 220 may form an air gap between the fingerprint recognition sensor 230 and display panel 220 (i.e., at a bottom of the groove 221) when the display panel 220 is attached to the mainboard 210, so as to meet the requirements of fingerprint recognition technology. Through the above-mentioned design, the present disclosure can alleviate problems of attaching impression and reliability-test impression caused by attaching the fingerprint recognition sensor to the display panel in the related solutions.

Further, as shown in FIG. 1, in an embodiment, an outer periphery of the fingerprint recognition sensor 230 is adhered and fixed on the mainboard 210 by an edge sealant layer 240. Material of the edge sealant layer 240 may be further optimized to provide a better adhesive effect, thereby overcoming the problem that the fingerprint recognition sensor 230 becomes loose or comes off. In other embodiments, the fingerprint recognition sensor 230 may also be fixed on the mainboard 210 by other fixing methods, which is not limited to this embodiment.

Further, as shown in FIG. 1, based on the design that the fingerprint recognition sensor 230 is adhered and fixed on the mainboard 210 by the edge sealant layer 240, in an embodiment, a part of the outer periphery of the fingerprint recognition sensor 230 is adhered and fixed to the mainboard 210 by the edge sealant layer 240. Taking that an orthographic projection of the fingerprint recognition sensor 230 on the mainboard 210 is substantially a rectangle as an example, a part of the fingerprint recognition sensor 230 that is fixed to the mainboard 210 by the edge sealant layer 240 may be roughly a semi-enclosed outline structure of the fingerprint recognition sensor 230. The "semi-enclosed outline structure" may be understood as one side of the fingerprint recognition sensor 230 and parts of two other sides adjacent to the one side, that is, an orthographic projection of the edge sealant layer 240 on the mainboard 210 is also roughly referred to as the "semi-enclosed" structure described above.

It should be noted that, in the exemplary description of this specification, the fingerprint recognition sensor 230 is divided into a first part for receiving light reflected by the fingerprint and a second part for implementing other functions such as electrical connection. The first part is the part fixed on the mainboard 210 by the edge sealant layer 240 of the semi-enclosed structure, and the second part is the part not fixed by the edge sealant layer 240. In addition, in the following description about a cooperating relationship between the groove 221 and the fingerprint recognition sensor 230, the cooperating relationship between the groove 221 and the above-mentioned first part will be mainly described.

Further, as shown in FIGS. 2 and 3, in an embodiment, a shape of the groove 221 formed in the display panel 220 is the same as that of the part of the fingerprint recognition sensor 230 to which the edge sealant layer 240 is adhered. In other embodiments, the shape of the groove 221 may also be different from the shape of the part of the fingerprint recognition sensor 230 to which the edge sealant layer 240 is adhered. Based on the function of accommodating the part of the fingerprint recognition sensor 230 to which the edge sealant layer 240 is adhered, various other shapes of the groove 221 may be selected as desired, which is not limited to this embodiment.

Further, as shown in FIGS. 2 and 3, in an embodiment, a size of the groove 221 formed in the display panel 220 is the same as that of the part of the fingerprint recognition sensor 230 to which the edge sealant layer 240 is adhered. The description of "same size" may be understood as that the size of the groove 221 is slightly larger than the size of the part of the fingerprint recognition sensor 230 to which the edge sealant layer 240 is adhered, so as to accommodate the light receiving part of the fingerprint recognition sensor 230.

Further, in an embodiment, a depth of the groove 221 formed in the display panel 220 is designed to be 20 μm to 50 μm, which may be adjusted as desired according to the actual needs of implementing the fingerprint recognition function. The "μm" refers to micrometer, and $1 \mu m = 1 \times 10^{-3}$ mm $= 1 \times 10^{-6}$ m.

It should be noted here that the display device shown in the drawings and described in the specification is just a few example of many types of display devices that can adopt the principle of the present disclosure. It should be clearly understood that the principle of the present disclosure is by no means limited to any details or any components of the display device shown in the drawings or described in the specification.

As described above, the display device provided by the present disclosure may be a mobile device such as a mobile phone or a Pad, however, the present disclosure is not limited thereto. The display device of the present disclosure may be any display device having a fingerprint recognition function.

In addition, a manufacturing method of the above display device is provided by the present disclosure. It is understood by those skilled in the art that, in order to apply the related design of the present disclosure to display devices or other processes in other applications, various modifications, additions, substitutions, deletions or other changes may made to the following embodiments, which still fall within the scope of the principle of the manufacturing method of the display device provided by the present disclosure.

In an embodiment, a method for manufacturing a display device provided by the present disclosure includes:
  providing a mainboard, a display panel, and a fingerprint recognition sensor;
  fixing the fingerprint recognition sensor on the mainboard;
  forming a groove on a surface of the display panel, wherein the groove corresponds to a position of the fingerprint recognition sensor; and
  coupling the surface of the display panel to the mainboard, so that an air gap is formed between the fingerprint recognition sensor and the display panel by the groove.

Further, in an embodiment, in the step of fixing the fingerprint recognition sensor on the mainboard, the fingerprint recognition sensor is adhered and fixed to the mainboard by an edge sealant layer.

Further, in an embodiment, in the step of forming a groove on a surface of the display panel, the groove is formed by cutting the display panel through a laser cutting method. Based on this, grooves with different shapes and sizes (including an opening length and width, and a depth) may be accurately formed on the surface of the display panel by the laser cutting method according to different functional requirements. In other embodiments, other precision cutting methods may be used instead of the above-mentioned laser cutting method to achieve the cutting and forming of the groove in the display panel.

It should be noted here that the method for manufacturing the display device shown in the drawings and described in the specification is just a few example of many methods for manufacturing the display device that can adopt the principle of the present disclosure. It should be clearly understood that the principle of the present disclosure is by no means limited to any details or any steps of the method for manufacturing the display device shown in the drawings or described in the specification.

In summary, in the display device and the manufacturing method thereof provided by the present disclosure, the fingerprint recognition sensor is disposed on the mainboard, the groove is disposed on the surface of the display panel facing the mainboard, and the air gap required for achieving a fingerprint recognition function is formed between the fingerprint recognition sensor and the display panel by the groove. Through the above-mentioned design, the present disclosure may alleviate problems of attaching impression and reliability-test impression caused by attaching the fingerprint recognition sensor to the display panel in the related solutions.

Exemplary embodiments of the display device, display apparatus, and method for manufacturing the display device provided by the present disclosure are described and/or illustrated in detail above. However, the embodiments of the present disclosure are not limited to the specific embodiments described herein. On the contrary, the components and/or steps of each embodiment may be used independently and separately from other components and/or steps described herein. Each component and/or each step of one embodiment may also be used in combination with other components and/or steps of other embodiments. When elements/components/etc. described and/or illustrated herein are explained, the terms "a", "an", "the above described", etc. are used to indicate the presence of one or more elements/components/etc. The terms "comprising", "including" and "having" are intended to mean an open-ended inclusion and mean that there may be an additional element/component/etc. in addition to the listed elements/components/etc.

Although the display device, display apparatus and method for manufacturing the display device provided by the present disclosure have been described according to different specific embodiments, those skilled in the art would recognize that the implementation of the present disclosure may be modified within the spirit and scope of the claims.

What is claimed is:

1. A display device, comprising:
  a mainboard, a display panel disposed on the mainboard, and a fingerprint recognition sensor, wherein:
    the fingerprint recognition sensor is disposed on the mainboard, and the fingerprint recognition sensor is located between the mainboard and the display panel;
    a groove is formed on a surface of the display panel facing the mainboard, and an orthographic projection of the groove on the mainboard corresponds to a position of the fingerprint recognition sensor; and the groove is configured to form an air gap between the fingerprint recognition sensor and the display panel, wherein an outer periphery of the fingerprint recognition sensor is adhered and fixed to the mainboard by an edge sealant layer.

2. The display device according to claim 1, wherein a part of the outer periphery of the fingerprint recognition sensor is adhered and fixed to the mainboard by the edge sealant layer.

3. The display device according to claim 1, wherein a shape of the groove is the same as that of a part of the fingerprint recognition sensor to which the edge sealant layer is adhered.

4. The display device according to claim 3, wherein a size of the groove is same as that of the part of the fingerprint recognition sensor to which the edge sealant layer is adhered.

5. The display device according to claim 1, wherein the groove has a depth of 20 μm to 50 μm.

6. The display device according to claim 1, wherein the groove accommodates at least a part of the fingerprint recognition sensor.

7. A method for manufacturing a display device, comprising:

providing a mainboard, a display panel, and a fingerprint recognition sensor;

fixing the fingerprint recognition sensor on the mainboard;

forming a groove on a surface of the display panel; and coupling the surface of the display panel to the mainboard, wherein the groove is formed so that after the surface of the display panel is coupled to the mainboard, an orthographic projection of the groove on the mainboard corresponds to a position of the fingerprint recognition sensor, and the groove forms an air gap between the fingerprint recognition sensor and the display panel, wherein, in fixing the fingerprint recognition sensor on the mainboard, the fingerprint recognition sensor is adhered and fixed to the mainboard by an edge sealant layer.

8. The method for manufacturing the display device according to claim 7, wherein, in forming the groove on the surface of the display panel, the groove is formed by cutting the display panel through a laser cutting method.

9. The display device according to claim 7, wherein:

the fingerprint recognition sensor comprises a first part for receiving fingerprint-reflected light and a second part for electrical connection; and the first part is adhered and fixed to the mainboard by the edge sealant layer, and the groove accommodates the first part.

10. The display device according to claim 9, wherein a shape of the first part is the same as that of the groove.

11. The display device according to claim 10, wherein a size of the first part is the same as that of the groove.

* * * * *